(12) United States Patent
Stolze

(10) Patent No.: US 8,933,569 B2
(45) Date of Patent: Jan. 13, 2015

(54) PRESSURE CONTACT ARRANGEMENT AND METHOD FOR PRODUCING A PRESSURE CONTACT ARRANGEMENT

(71) Applicant: Infineon Technologies AG, Neubiberg (DE)

(72) Inventor: Thilo Stolze, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 95 days.

(21) Appl. No.: 13/854,987

(22) Filed: Apr. 2, 2013

(65) Prior Publication Data

US 2013/0278326 A1  Oct. 24, 2013

(30) Foreign Application Priority Data

Apr. 18, 2012 (DE) .......................... 10 2012 206 407

(51) Int. Cl.
| | |
|---|---|
| H01L 23/48 | (2006.01) |
| H01L 23/52 | (2006.01) |
| H01L 21/768 | (2006.01) |
| H01L 23/051 | (2006.01) |
| H01L 23/492 | (2006.01) |

(52) U.S. Cl.
CPC .......... *H01L 23/52* (2013.01); *H01L 21/76885* (2013.01); *H01L 23/051* (2013.01); *H01L 23/492* (2013.01)
USPC .......................................... 257/773; 327/517

(58) Field of Classification Search
USPC ........................... 327/516, 517; 257/773, 748
See application file for complete search history.

(56) References Cited

U.S. PATENT DOCUMENTS

| 3,676,308 | A | 7/1972 | Brown |
| 4,126,883 | A | 11/1978 | Martin |
| 8,154,131 | B2 * | 4/2012 | Trezza et al. .................. 257/773 |

FOREIGN PATENT DOCUMENTS

| DE | 4442295 A1 | 6/1995 |
| EP | 0962973 A1 | 12/1999 |
| EP | 2278616 A2 | 1/2011 |
| JP | 4120772 A | 4/1992 |
| JP | 4120772 B2 | 7/2008 |

* cited by examiner

*Primary Examiner* — Hai L Nguyen
(74) *Attorney, Agent, or Firm* — Murphy, Bilak & Homiller, PLLC

(57) ABSTRACT

A pressure contact arrangement includes a pressure contact device having an upper contact piece and a lower contact piece, one or more vertical first semiconductor chips and a peripherally closed adhesive bead. Each vertical first semiconductor chip has an upper side, a lower side opposite the upper side, a peripherally closed narrow side adjoining the upper side and the lower side and connecting the upper and lower sides, an upper electrical contact face arranged on the upper side, and a lower electrical contact face arranged on the lower side. The peripherally closed adhesive bead surrounds each vertical first semiconductor chip and fastens each vertical first semiconductor chip to the pressure contact device. A peripherally closed connecting face is provided between each adhesive bead and the narrow side of the corresponding vertical first semiconductor chip that laterally surrounds the vertical first semiconductor chip.

19 Claims, 4 Drawing Sheets

PRESSURE CONTACT ARRANGEMENT AND METHOD FOR PRODUCING A PRESSURE CONTACT ARRANGEMENT

PRIORITY CLAIM

This application claims priority to German Patent Application No. 10 2012 206 407.9, filed on 18 Apr. 2012, the content of said German application incorporated herein by reference in its entirety.

TECHNICAL FIELD

The present invention relates to pressure contact arrangements.

BACKGROUND

Pressure contact arrangements are often used for making electrical contact with large-area semiconductor chips. In this case, one or more semiconductor chips are clamped between two contact pieces to make electrically conductive pressure contact between them. During operation, very high potential differences, for example a few 1000 volts or even more than 10,000 volts can be present at the contact pieces. In order to avoid voltage flashovers which may occur owing to these high potential differences, some pressure contact modules are filled with an inert gas, but this requires a hermetically gastight module housing. Such a housing involves a degree of complexity which is not inconsiderable both for the production and maintenance of such a module.

Instead of an inert gas, a pressure contact module can also be cast with an electrically insulating casting compound only after production of the electrical pressure contacts. The commercial casting compounds generally used for this purpose usually contain silicone oil, however, which is associated with the disadvantage that the oil, over the course of time, creeps between the contact faces of the pressure contact connection and thus increases the electrical contact resistance. A further disadvantage results in the fact that the semiconductor chips need to be positioned very precisely relative to the contact pieces. Therefore, the semiconductor chips are often provided in cutouts of positioning devices, which should only have low tolerances with respect to the semiconductor chips. This means that there are gaps with a very small width between the positioning device and the semiconductor chips, and these gaps cannot be filled reliably during casting with casting compound. As such there a high risk of voltage flashovers occurring in the case of the cast module, as a result of which the already finished module as a whole becomes unusable.

SUMMARY

Embodiments described herein provide a pressure contact arrangement and a method for producing and for operating a pressure contact arrangement.

According to one embodiment, the pressure contact arrangement comprises a pressure contact device and one or more vertical first semiconductor chips. The pressure contact device has an upper contact piece and a lower contact piece. Each first semiconductor chip has an upper side, a lower side opposite the upper side and a peripherally closed narrow side adjoining the upper side and the lower side and connecting the two sides. In addition, each first semiconductor chip has an upper electrical contact face arranged on the upper side, and a lower electrical contact face arranged on the lower side. Each first semiconductor chip is surrounded by a peripherally closed adhesive bead and fastened to the pressure contact device by the adhesive bead. In each case one connecting face which is closed in the form of a ring, which laterally surrounds the corresponding first semiconductor chip and at which the adhesive bead is cohesively connected to the narrow side, is provided between the adhesive bead and the narrow side.

Such a pressure contact arrangement can be produced in a simple manner by virtue of the fact that the first semiconductor chip(s) is/are first fastened on the pressure contact device by means of the respective peripherally closed adhesive bead and only then are the upper contact piece and the lower contact piece pressed against one another in such a way that an electrically conductive pressure contact connection is produced between the upper electrical contact face of each of the first semiconductor chips and the upper contact piece, and that an electrically conductive pressure contact connection is produced between the lower electrical contact face of each of the first semiconductor chips and the lower contact piece.

By virtue of the use of the peripherally closed adhesive bead(s), in a pressure contact arrangement in accordance with the present invention, voltage flashovers are reliably avoided. This means that a pressure contact arrangement in accordance with the present invention does not need to be cast or does not need to be cast completely, i.e. that the region located between the upper and the lower contact pieces needs neither to have an inert gas flowing through it nor to be cast with a casting compound, to be precise even when a high potential difference of for example more than 1000 volts or more than 10,000 volts is present between the upper and the lower contact pieces. Instead, an air volume can be located in the region between the upper and lower contact pieces.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

Figure 1:
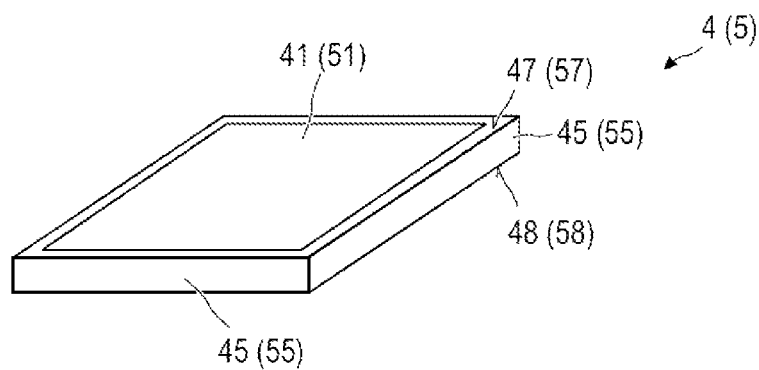
FIG. 1 shows a perspective plan view of the upper side of a semiconductor chip.
Figure 2:
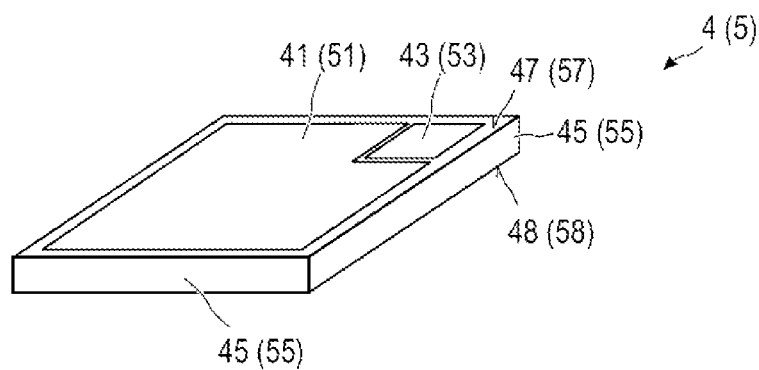
FIG. 2 shows a perspective plan view of the upper side of a further semiconductor chip.
Figure 3:
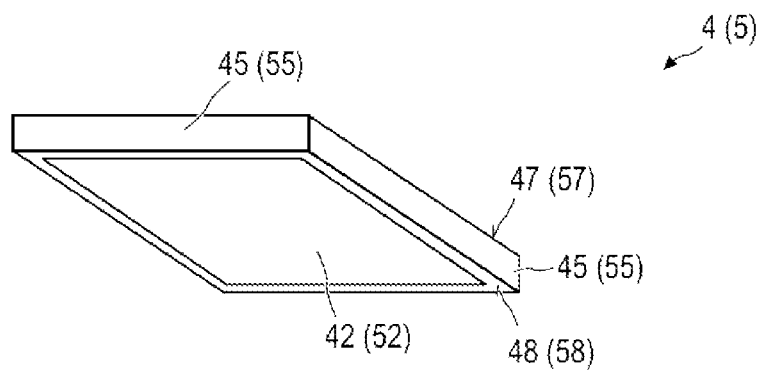
FIG. 3 shows a perspective view of the lower side of a semiconductor chip.

FIG. 1 shows a perspective view of a first semiconductor chip 4 or a second semiconductor chip 5, as can be used in pressure contact arrangements described below. In FIGS. 1 to 3, the reference symbols without parentheses relate to the first semiconductor chips 4, the reference symbols with parentheses relate to the second semiconductor chips 5. In the text which follows, the design of the first and second semiconductor chips 4, 5 is explained by way of example with reference to the first semiconductor chip 4. However, the second semiconductor chips 5 can have the same design as the first semiconductor chips 4.

The semiconductor chip 4 shown in FIG. 1 has an upper side 47 and a lower side 48 opposite the upper side 47. The upper side 47 and the lower side 48 are provided by the sides of the semiconductor chip 4 with the greatest area. An upper electrical contact face 41 is located on the upper side 47. In addition, the semiconductor chip 4 has a peripherally closed narrow side 45, which connects the upper side 47 and the lower side 48 to one another.

In accordance with an alternative configuration shown in FIG. 2 of a first semiconductor chip 4, the upper side 47 can also have an optional control contact face 43 in addition to the upper electrical contact face 41. The control contact face 43 can be, for example, a gate connection or a base connection, which is used for controlling the first semiconductor chip 4.

The lower sides 48 of the first semiconductor chips 4 explained in FIGS. 1 and 2 can, as is shown in FIG. 3, have a lower electrical contact face 42. In the case of a first semiconductor chip 4, which is designed as shown in FIGS. 1 and 3, this semiconductor chip can be a diode, in which the electrical contact faces 41 and 42 represent the anode and cathode connections or the cathode and anode connections, respectively.

If the first semiconductor chip 4 is configured as shown in FIGS. 2 and 3 and, accordingly, has a control connection 43, the first semiconductor chip 4 can be any desired controllable vertical semiconductor component, for example a transistor, in particular a field-effect transistor, an IGBT (insulated gate bipolar transistor), a MOSFET (metal oxide semiconductor field effect transistor), a junction gate field effect transistor or a thyristor.

Figure 4A:
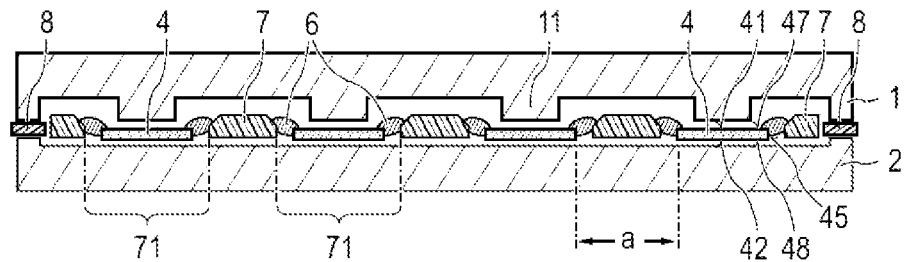
FIG. 4A shows a sectional view through the components of a pressure contact arrangement, in which a plurality of semiconductor chips are adhesively bonded in cutouts in a holding frame by means of peripherally closed adhesive beads.

FIG. 4A shows a cross section through the components of a pressure contact arrangement directly prior to the production of the pressure contact. These components comprise a pressure contact device with an upper contact piece 1 and a lower contact piece 2. The contact pieces 1 and 2 have good electrical conductivity, and can consist of copper, a copper alloy, aluminum, an aluminum alloy, molybdenum or a molybdenum alloy, for example, or comprise such metals or alloys. By way of example four first semiconductor chips 4 are arranged between the upper contact piece 1 and the lower contact piece 2. Each first semiconductor chip 4 has an upper electrical contact face 41 and a lower electrical contact face 42. The first semiconductor chips 4 can have in particular a design as has been explained previously with reference to FIGS. 1 to 3.

The upper contact piece 1 has an optional contact stamp 11 in the form of a projection for each of the first semiconductor chips 4. The contact stamp 11 makes electrical contact with the upper electrical contact face 41 of the corresponding first semiconductor chip 4. FIG. 4 shows the pressure contact arrangement before the upper contact piece 1 and the lower contact piece 2 are pressed against one another so as to produce pressure contact connections between the upper contact piece 1 and the upper electrical contact faces 41 and between the lower contact piece 2 and the lower electrical contact faces 42.

In order to enable precise positioning of the first semiconductor chips 4, an optional, electrically insulating holding frame 7, for example consisting of plastics or ceramic, is provided. The holding frame 7 has a cutout 71 for each of the first semiconductor chips 4, with the corresponding first semiconductor chip 4 being adhesively bonded into the cutout 71 by means of a peripherally closed adhesive bead 6, with the result that this cutout 71 is completely closed by the first semiconductor chip 4 and the adhesive bead 6. Since the holding frame 7 and the adhesive beads 6 consist of an electrically insulating material, the upper electrical contact faces 41 and the lower electrical contact faces 42 are decoupled electrically from one another in a reliable manner, with the result that leakage currents and voltage flashovers are avoided. To avoid voltage flashovers between the first contact piece 1 and the second contact piece 2, one or more insulators 8 are provided peripherally between the contact pieces 1, 2.

Figure 4B:
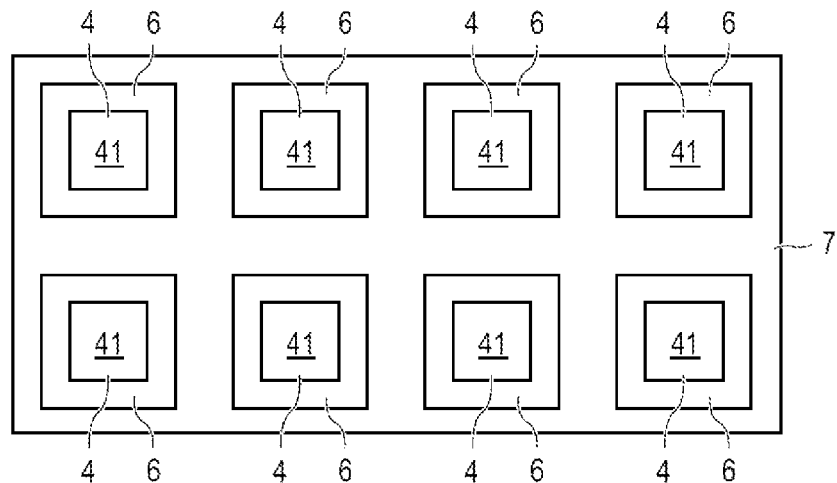
FIG. 4B shows a plan view of the holding frame of FIG. 4A, equipped with semiconductor chips.

FIG. 4B shows a plan view of the holding frame 7 equipped with the first semiconductor chips 4. In this plan view, the ring-shaped profile of the adhesive beads 6 is clearly shown.

Since the adhesive beads 6 also consist of an elastic material and bridge a gap between the corresponding first semiconductor chips 4 and the holding frame 7, the first semiconductor chips 4 adhesively bonded into the respective cutout 71 can be deflected upwards or downwards and thus aligned precisely when the upper contact piece 1 is pressed in the direction of the lower contact piece 2 to produce the pressure contact connections and thereby pressure contact is made with the respective first semiconductor chip 4.

Figure 4C:
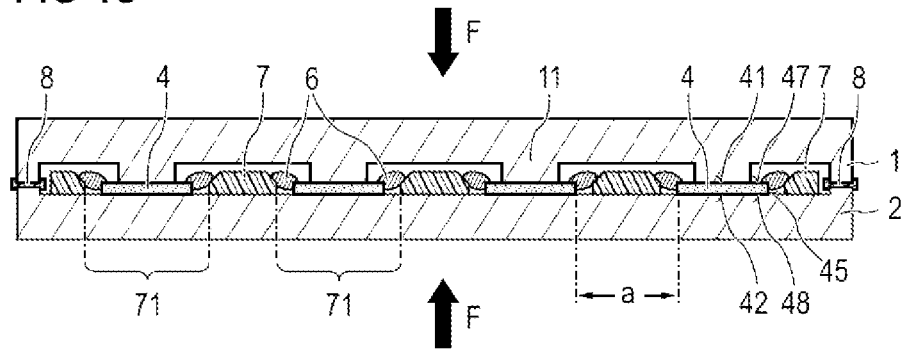
FIG. 4C shows a sectional view in accordance with FIG. 4A in which the upper and lower contact pieces are pressed against one another to form a pressure contact arrangement.

FIG. 4C shows the components illustrated in FIG. 4A once the upper contact piece 1 and the lower contact piece 2 have been pressed against one another under the effect of a force F to form a pressure contact arrangement.

In order to produce the arrangement shown in FIG. 4C, the cutouts 71 of the holding frame 7 can be equipped with in each case a first semiconductor chip 4 by virtue of each of these first semiconductor chips 4 being adhesively bonded into the relevant cutout 71 by means of a separate peripherally closed adhesive bead 6 and the cutout 71 thus being closed completely. The holding frame 7, the first semiconductor chips 4 adhesively bonded into the holding frame 7 and the adhesive beads 6 therefore form a composite structure, which can be prefabricated without any problems and positioned between the upper contact piece 1 and the lower contact piece 2. After the positioning, only the upper contact piece 1 and the lower contact piece 2 need to be pressed against one another, with the result that electrical pressure contact connections are formed between the upper contact piece 1 and the upper electrical contact faces 41 and between the lower contact piece 2 and the lower electrical contact faces 42. The force required for pressing the contact pieces 1, 2 against one another can be applied by a cascaded clamping composite structure, for example during later fitting.

Figure 5A:
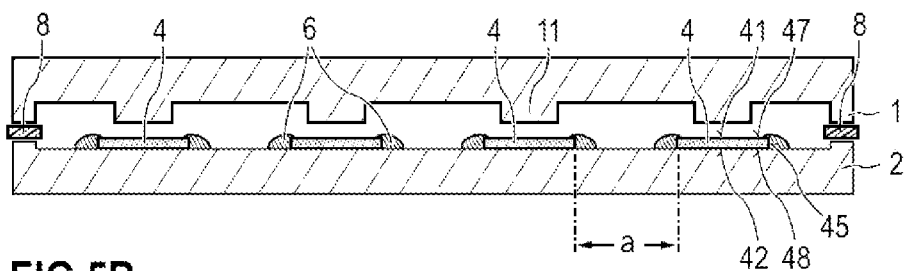
FIG. 5A shows a cross section through the components of a pressure contact arrangement, in which a plurality of semiconductor chips are fitted on one of the contact pieces by means of peripherally closed adhesive beads.

In accordance with a further configuration shown in FIG. 5A, by way of example four first semiconductor chips 4 are each adhesively bonded next to one another to the lower contact piece 2 by means of a peripherally closed adhesive bead 6. In this case, a cohesive, electrically conductive connection is provided between none of the lower electrical contact faces 42 and the lower contact piece 2.

Figure 5B:
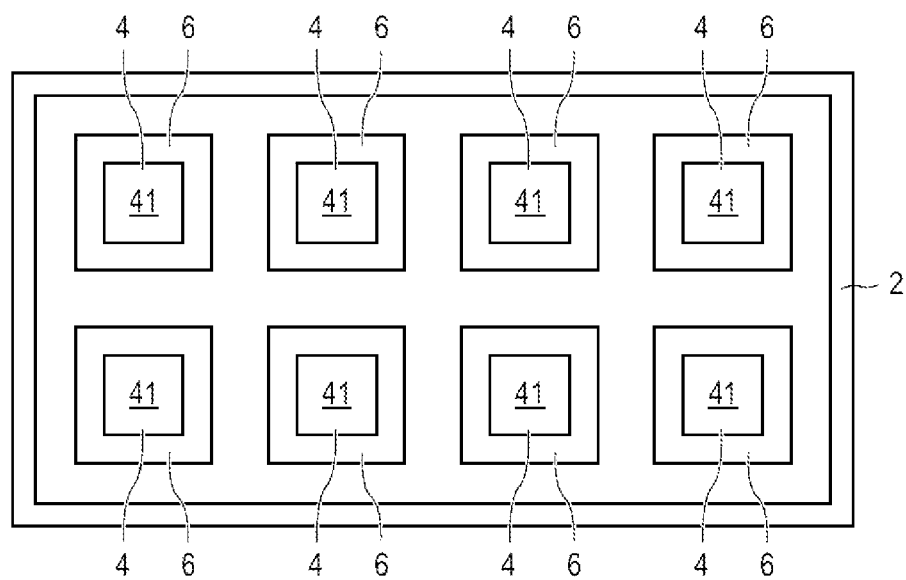
FIG. 5B shows a plan view of the contact piece of FIG. 5A, equipped with semiconductor chips.

Since each of the first semiconductor chips 4 is adhesively bonded to the lower contact piece 2 by means of a peripherally formed adhesive bead 6, the upper electrical contact faces 41 are sufficiently decoupled electrically with respect to the lower contact piece 2 and therefore with respect to the lower electrical contact faces 42, with the result that voltage flashovers and leakage currents between the upper electrical contact faces 41 and the lower electrical contact faces 42 can be reliably avoided. FIG. 5B shows a plan view of the lower contact piece 2 which has previously been equipped with the first semiconductor chips 4.

Figure 5C:
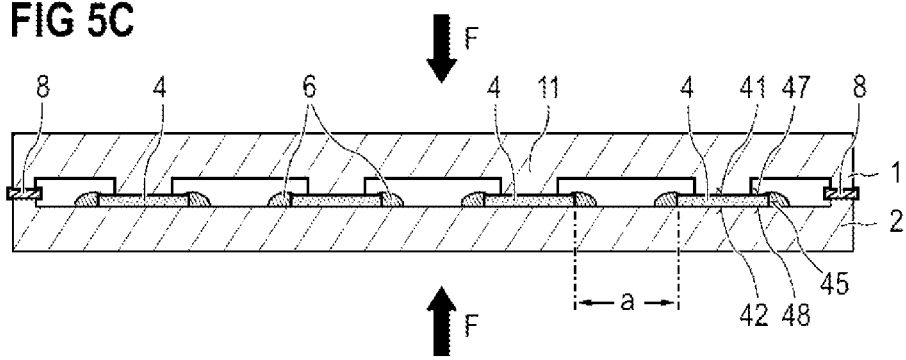
FIG. 5C shows a sectional view in accordance with FIG. 5A in which the upper and the lower contact pieces are pressed against one another to form a pressure contact arrangement.

As is furthermore shown in FIG. 5C, the lower contact piece 2, which has previously been equipped as shown in FIG. 5B, and the upper contact piece 1 can be pressed against one another by means of a contact-pressure force F, with the result that an electrically conductive pressure contact is formed between the upper contact piece 1 and each of the upper electrical contact faces 41 and between the lower contact piece 2 and each of the lower electrical contact faces 42.

Figure 6A:
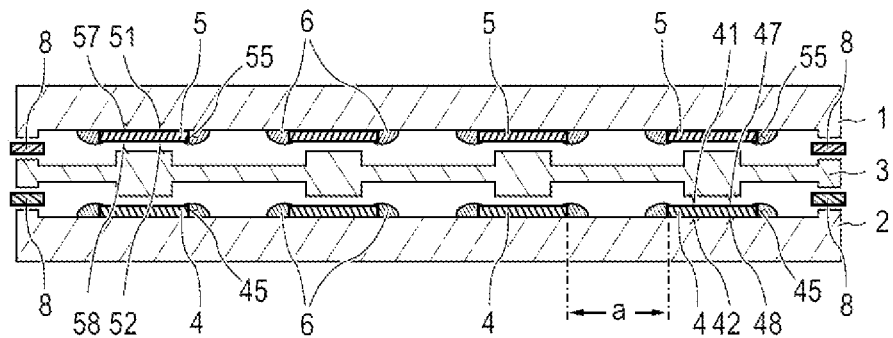
FIG. 6A shows a cross section through the components of a pressure contact arrangement, in which a plurality of first semiconductor chips are each fastened with a ring-shaped adhesive bead on a lower contact piece and a plurality of second semiconductor chips are each fastened by means of a peripheral adhesive bead on an upper contact piece.

In accordance with a further example shown in FIG. 6A, two or more semiconductor chips can also be connected electrically in series. In the arrangement shown in FIG. 6, a plurality of first semiconductor chips 4 are fastened on the lower contact piece 2 with the aid of in each case one ring-shaped adhesive bead 6, as has been explained previously with reference to FIGS. 5A and 5B.

Correspondingly, a plurality of second semiconductor chips 5 are fastened on the upper contact piece 1 next to one another with the aid of in each case one peripherally closed adhesive bead 6, with the result that the upper electrical contact faces 51 of the second semiconductor chips 5 face the upper contact piece 1. Accordingly, the lower electrical contact faces 52 of the second semiconductor chips 5 face the lower contact piece 2 and the upper electrical contact face 41 of one of the first semiconductor chips 4.

In addition, an electrically conductive intermediate piece 3 is arranged between the upper electrical contact faces 41 of the first semiconductor chips 4 and the lower electrical contact faces 52 of the second semiconductor chips 5. The intermediate piece 3 is designed in such a way that it can form electrically conductive pressure contact connections with the upper electrical contact faces 41 of the first semiconductor chips 4 and with the lower electrical contact faces 52 of the second semiconductor chips 5 when the upper contact piece 1 and the lower contact piece 2 are pressed against one another under the effect of a contact-pressure force F, the result of which is shown in FIG. 6B.

Figure 7:
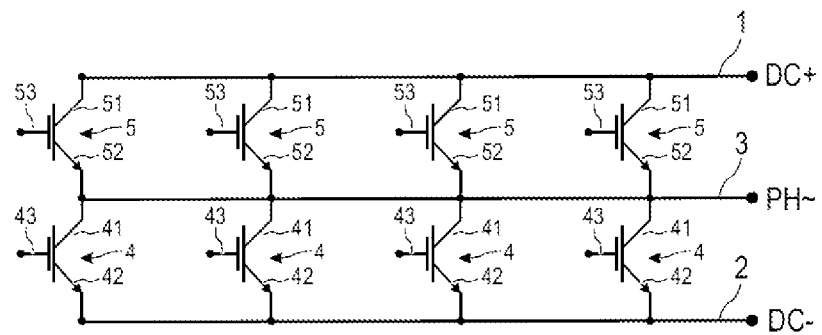
FIG. 7 shows a circuit diagram with respect to the pressure contact arrangement shown in FIG. 6.

In the state in which the upper and lower contact pieces 1, 2 are pressed against one another, the lower electrical contact faces 42 of the first semiconductor chips 4 are electrically conductively connected to one another by the lower contact piece 2 and the upper electrical contact faces 51 of the second semiconductor chips 5 are electrically conductively connected to one another by the upper contact piece 1. In addition, the upper electrical contact faces 41 of the first semiconductor chips 4 and the lower contact faces 52 of the second semiconductor chips 5 are electrically conductively connected to one another by the electrically conductive intermediate piece 3. In this way, for example, a half-bridge circuit can be realized, as is illustrated in FIG. 7. In this case, each of the first semiconductor chips 4 has a load path, which is formed between the upper electrical contact face 41 and the lower electrical contact face 42 and which can be set to the on or off state with the aid of a control connection 43. Correspondingly, each of the second semiconductor chips 5 has a load path between the upper electrical contact face 51 and the lower electrical contact face 52, which load path can be set to the on or off state with the aid of a control connection 53. In order to increase the current-carrying capacity, if required the load paths of two or more first semiconductor chips 4 can be connected electrically in parallel with one another. Correspondingly, the load paths of two or more second semiconductor chips 5 can also be connected electrically in parallel with one another.

Figure 6B:
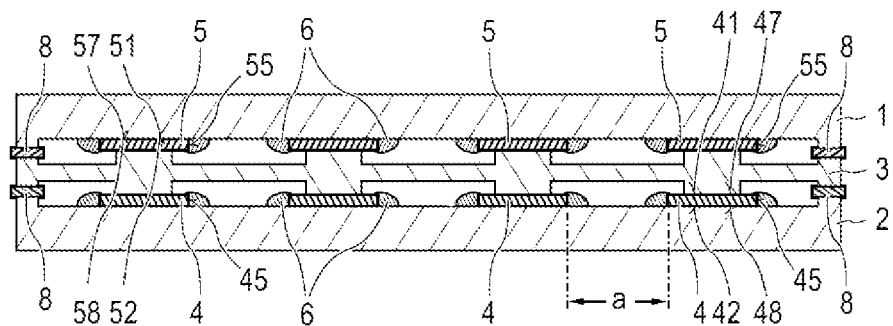
FIG. 6B shows a sectional view in accordance with FIG. 6A in which the upper and lower contact pieces are pressed against one another to form a pressure contact arrangement.

In order to realize the parallel circuit comprising two or more first semiconductor chips 4, the upper electrical contact faces 41 of the first semiconductor chips 4 can be electrically conductively connected to one another, which is performed in the example shown in FIGS. 6A and 6B with the aid of the electrically conductive intermediate piece 3. In addition, the second electrical contact faces 42 are electrically conductively connected to one another, which, in the example shown in FIGS. 6A and 6B, takes place with the aid of the lower contact piece 2.

In order to connect two or more second semiconductor chips 5 in parallel with one another, the first electrical contact faces 51 of the second semiconductor chips 5 are electrically conductively connected to one another, which, in the exemplary embodiment shown in FIGS. 6A and 6B, takes place with the aid of the upper contact piece 1. In addition, the lower electrical contact faces 52 are electrically conductively connected to one another, which, in the exemplary embodiment shown in FIGS. 6A and 6B, takes place with the aid of the electrically conductive contact piece 3.

In principle, however, it is not necessary to connect two or more first semiconductor chips 4 or two or more second semiconductor chips 5 in each case electrically in parallel with one another. Thus, for example, it is also possible for only precisely one first semiconductor chip 4 and one second semiconductor chip 5 to be provided.

In any case, with such a half-bridge arrangement as can be used, for example, in a converter, the load paths of all of the first semiconductor chips 4 are connected in series with the load paths of all of the second semiconductor chips 5. For this purpose, an intermediate circuit voltage can be supplied to the half-bridge circuit by virtue of the upper contact piece 1 being connected to a first supply potential (DC+) and the lower contact piece 2 being connected to a second supply potential (DC−) which is different to the first supply potential. If the load paths of all of the first semiconductor chips 4 are in the off state and the load paths of one, several or all of the second semiconductor chips 5 are in the on state, the potential DC+ is substantially present at the intermediate piece 3. If, conversely, the load paths of all of the second semiconductor chips 5 are in the off state and the load paths of one, several or all of the first semiconductor chips 4 are in the on state, the supply potential DC− is substantially present at the intermediate piece 3. In this way, it is possible to alternately apply different potentials DC+ and DC− to the intermediate piece 3 by suitably switching over the first and second semiconductor chips 4, 5 between the off and on state, with the result that an alternating potential PH~ can be tapped off at the intermediate piece 3.

With a pressure contact arrangement as described herein, the distance 'a' (see, for example, FIGS. 4A, 4C, 5A, 5C, 6A and 6B) between two adjacent ones of the first semiconductor chips 4 can be selected to be less than, for example, 15 mm or even less than 10 mm, to be precise even when the pressure contact arrangement is operated at a potential difference between the first contact piece 1 and the second contact piece 2 of more than 1000 V e.g. of more than 10,000 V.

By virtue of the elasticity of the adhesive beads 6 used, the first semiconductor chips 4 and the second semiconductor chips 5 can also still be aligned in the already adhesively bonded state when the first contact piece 1 and the second contact piece 2 are pressed against one another so as to form electrical pressure contact connections. Therefore, each of the previously explained adhesive beads 6 in accordance with ISO 37 can have an elongation at break of at least 5%, of at least 50%, or of at least 350%.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A pressure contact arrangement, comprising:
   a pressure contact device having an upper contact piece and a lower contact piece;
   one or more vertical first semiconductor chips, each vertical first semiconductor chip having:
      an upper side;
      a lower side opposite the upper side;
      a peripherally closed narrow side adjoining the upper side and the lower side and connecting the upper and lower sides;
      an upper electrical contact face arranged on the upper side; and
      a lower electrical contact face arranged on the lower side; and
   a peripherally closed adhesive bead surrounding each vertical first semiconductor chip and fastening each vertical first semiconductor chip to the pressure contact device, wherein a peripherally closed connecting face is provided between each adhesive bead and the narrow side of the corresponding vertical first semiconductor chip that laterally surrounds the vertical first semiconductor chip.

2. The pressure contact arrangement of claim 1, wherein the upper contact piece has a contact stamp for each vertical first semiconductor chip for making pressure contact with the upper electrical contact face of each vertical first semiconductor chip.

3. The pressure contact arrangement of claim 1, wherein each vertical first semiconductor chip is fastened on the lower contact piece by the corresponding adhesive bead peripherally surrounding the vertical first semiconductor chip.

4. The pressure contact arrangement of claim 1, further comprising a holding frame having a cutout in which each vertical first semiconductor chip is arranged, each vertical first semiconductor chip being fastened to the holding frame by the corresponding adhesive bead peripherally surrounding the vertical first semiconductor chip.

5. The pressure contact arrangement of claim 1, wherein a cohesive, electrically conductive connection is provided between none of the upper electrical contact faces and the upper contact piece.

6. The pressure contact arrangement of claim 1, wherein a cohesive, electrically conductive connection is provided between none of the lower electrical contact faces and the lower contact piece.

7. The pressure contact arrangement of claim 1, wherein a distance between two adjacent ones of the vertical first semiconductor chips is less than 15 mm.

8. The pressure contact arrangement of claim 1, further comprising one or more vertical second semiconductor chips, each vertical second semiconductor chip having:
   an upper side and a lower side opposite the upper side;
   an upper electrical contact face arranged on the upper side; and
   a lower electrical contact face arranged on the lower side,
   wherein each vertical second semiconductor chip is arranged between the upper contact piece and one of the vertical first semiconductor chips such that the upper electrical contact face of that vertical second semiconductor chip faces the upper contact piece, and the lower electrical contact face of that vertical second semiconductor chip faces the upper electrical face of the corresponding vertical first semiconductor chip.

9. The pressure contact arrangement of claim 8, further comprising an electrically conductive intermediate piece between the upper electrical contact face of each vertical first semiconductor chip and the lower electrical contact face of each vertical second semiconductor chip, wherein the electrically conductive intermediate piece is electrically conductively connected to the upper electrical contact face of each vertical first semiconductor chip and the lower electrical contact face of each vertical second semiconductor chip.

10. The pressure contact arrangement of claim 9, further comprising at least one of:
   a cohesive, electrically conductive connection between the intermediate piece and none of the upper electrical contact faces of the vertical first semiconductor chips; and
   a cohesive, electrically conductive connection between the intermediate piece and none of the lower electrical contact faces of the vertical second semiconductor chips.

11. The pressure contact arrangement of claim 1, wherein each vertical first semiconductor chip is arranged between the upper contact piece and the lower contact piece and the upper contact piece and the lower contact piece are pressed against one another so that an electrically conductive pressure contact connection is provided between the upper electrical contact face of each of the vertical first semiconductor chips and the upper contact piece, and an electrically conductive pressure contact connection is provided between the lower electrical contact face of each vertical first semiconductor chip and the lower contact piece.

12. The pressure contact arrangement of claim 1, wherein each adhesive bead has a closed ring form and an elongation at break in accordance with ISO 37 of at least 5%, of at least 50%, or of at least 350%.

13. A method for manufacturing a pressure contact arrangement, the method comprising:
providing a pressure contact device having an upper contact piece and a lower contact piece;
providing one or more vertical first semiconductor chips, each vertical first semiconductor chip having an upper side, a lower side opposite the upper side, a peripherally closed narrow side adjoining the upper side and the lower side and connecting the upper and lower sides, an upper electrical contact face arranged on the upper side, and a lower electrical contact face arranged on the lower side;
surrounding each vertical first semiconductor chip with a peripherally closed adhesive bead that fastens each vertical first semiconductor chip to the pressure contact device; and
subsequently pressing the upper contact piece and the lower contact piece against one another in such a way that an electrically conductive pressure contact connection is formed between the upper electrical contact face of each vertical first semiconductor chip and the upper contact piece, and an electrically conductive pressure contact connection is formed between the lower electrical contact face of each vertical first semiconductor chip and the lower contact piece.

14. The method of claim 13, further comprising:
providing one or more vertical second semiconductor chips, each vertical second semiconductor chip having an upper side and a lower side opposite the upper side, an upper electrical contact face arranged on the upper side, and a lower electrical contact face arranged on the lower side; and
arranging each vertical second semiconductor chip between the upper contact piece and one of the vertical first semiconductor chips such that the upper electrical contact face of that vertical second semiconductor chip faces the upper contact piece, and the lower electrical contact face of that vertical second semiconductor chip faces the upper electrical face of the corresponding vertical first semiconductor chip.

15. The method of claim 14, further comprising arranging an electrically conductive intermediate piece between the upper electrical contact face of each vertical first semiconductor chip and the lower electrical contact face of each vertical second semiconductor chip so that the electrically conductive intermediate piece is electrically conductively connected to the upper electrical contact face of each vertical first semiconductor chip and the lower electrical contact face of each vertical second semiconductor chip.

16. The method of claim 13, wherein the upper contact piece has a contact stamp for each vertical first semiconductor chip, the method further comprising pressing the contact stamp against the upper electrical contact face of each vertical first semiconductor chip.

17. The method of claim 13, wherein the pressure contact device further comprises a holding frame having a cutout in which each vertical first semiconductor chip is arranged, the method further comprising fastening each vertical first semiconductor chip to the holding frame by the corresponding adhesive bead peripherally surrounding the vertical first semiconductor chip.

18. A method of operating a device, comprising:
providing a pressure contact arrangement comprising a pressure contact device having an upper contact piece and a lower contact piece, one or more vertical first semiconductor chips each having an upper side, a lower side opposite the upper side, a peripherally closed narrow side adjoining the upper side and the lower side and connecting the upper and lower sides, an upper electrical contact face arranged on the upper side, and a lower electrical contact face arranged on the lower side, and a peripherally closed adhesive bead surrounding each vertical first semiconductor chip and fastening each vertical first semiconductor chip to the pressure contact device, wherein a peripherally closed connecting face is provided between each adhesive bead and the narrow side of the corresponding vertical first semiconductor chip that laterally surrounds the vertical first semiconductor chip; and
applying a potential difference of more than 1000 V between the first contact piece and the second contact piece.

19. The method of claim 18, comprising applying a potential difference of more than 10,000 V between the first contact piece and the second contact piece.

* * * * *